United States Patent
Lee et al.

(10) Patent No.: US 6,448,649 B1
(45) Date of Patent: Sep. 10, 2002

(54) MULTI-LAYER WIRING STRUCTURE HAVING CONDUCTIVE SIDEWALL ETCH STOPPERS AND A STACKED PLUG INTERCONNECT

(75) Inventors: Chung-Kuang Lee; Pin-Nan Tseng, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 08/995,334

(22) Filed: Dec. 22, 1997

Related U.S. Application Data

(62) Division of application No. 08/643,716, filed on May 6, 1996, now Pat. No. 5,756,396.

(51) Int. Cl.[7] .............................................. H01L 23/48
(52) U.S. Cl. ...................... 257/758; 257/774; 257/763
(58) Field of Search ................................. 257/758, 774, 257/763; 438/629, 628, 774, 759, 760, 768, 758

(56) References Cited

U.S. PATENT DOCUMENTS

| | | | | |
|---|---|---|---|---|
| 4,924,295 A | * | 5/1990 | Kiiecher ........................ | 357/71 |
| 4,962,060 A | * | 10/1990 | Sliwa et al. ................. | 437/192 |
| 4,980,752 A | * | 12/1990 | Jones, Jr. ..................... | 357/71 |
| 5,132,756 A | * | 7/1992 | Matsuda ..................... | 357/23.1 |
| 5,202,579 A | * | 4/1993 | Fujii et al. ................... | 257/751 |
| 5,286,674 A | * | 2/1994 | Roth et al. .................. | 437/190 |
| 5,300,813 A | * | 4/1994 | Joshi et al. ................. | 257/752 |
| 5,350,712 A | * | 9/1994 | Shibata ........................ | 438/596 |
| 5,451,543 A | * | 9/1995 | Woo et al. .................. | 437/195 |
| 5,462,893 A | * | 10/1995 | Matsuoka et al. .......... | 437/195 |
| 5,472,912 A | * | 12/1995 | Miller ......................... | 437/194 |
| 5,514,622 A | * | 5/1996 | Bornstein et al. ........... | 438/628 |
| 5,582,971 A | * | 12/1996 | Chen et al. .................. | 438/643 |
| 5,589,713 A | * | 12/1996 | Lee et al. .................... | 257/773 |
| 5,592,024 A | * | 1/1997 | Aoyama et al. ............. | 257/751 |
| 5,593,920 A | * | 1/1997 | Haslam et al. .............. | 437/195 |
| 5,622,894 A | * | 4/1997 | Jang et al. ................... | 438/629 |
| 5,661,082 A | * | 8/1997 | Hsu et al. .................... | 438/612 |
| 5,808,364 A | * | 9/1998 | Cronin et al. ................ | 257/758 |
| 6,127,257 A | * | 10/2000 | Pintchovski et al. ........ | 438/625 |

FOREIGN PATENT DOCUMENTS

| | | | |
|---|---|---|---|
| EP | 0524818 A1 | * | 1/1993 |
| EP | 0552968 A2 | * | 7/1993 |

* cited by examiner

*Primary Examiner*—Steven Loke
*Assistant Examiner*—Ori Nadau
(74) *Attorney, Agent, or Firm*—George O. Saile; Stephen B. Ackerman; William J. Stoffel

(57) ABSTRACT

The present invention provides a structure and a method of electrically connecting wiring layers by forming a stacked plug interconnect. The first wiring layer is formed over a dielectric layer and a top barrier layer is formed over the top of the first wire layer. Next, first sidewall spacers preferably composed of titanium nitride and tungsten are formed on the first wire layer sidewalls. An inter metal dielectric layer is formed over the surface. A via is then etched exposing the first wiring layer. The first titanium nitride/tungsten spacers act as an etch stop for the via etch and also increase the contact area of the wiring layers. A tungsten plug with an outer TiN barrier layer is formed filling the via contacting the first wiring layer. On top of the tungsten plug, a second wiring layer is formed also having titanium nitride and tungsten sidewall spacers. The spacers also fill in the recesses in the TiN plug barrier layer and fill in dimples in the top of the tungsten plugs.

12 Claims, 8 Drawing Sheets

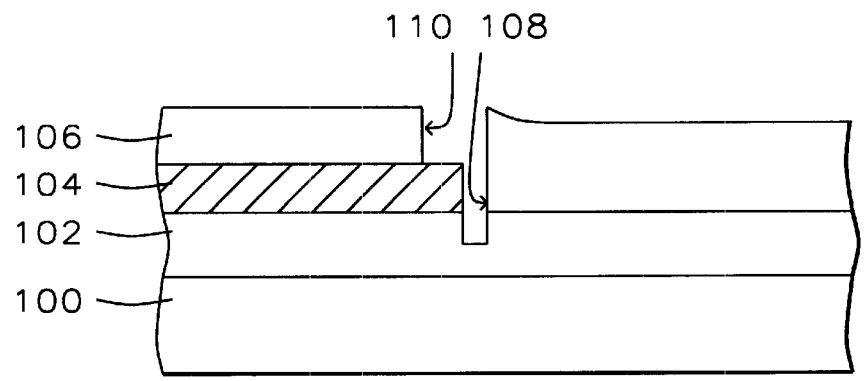
FIG. 1A – Prior Art
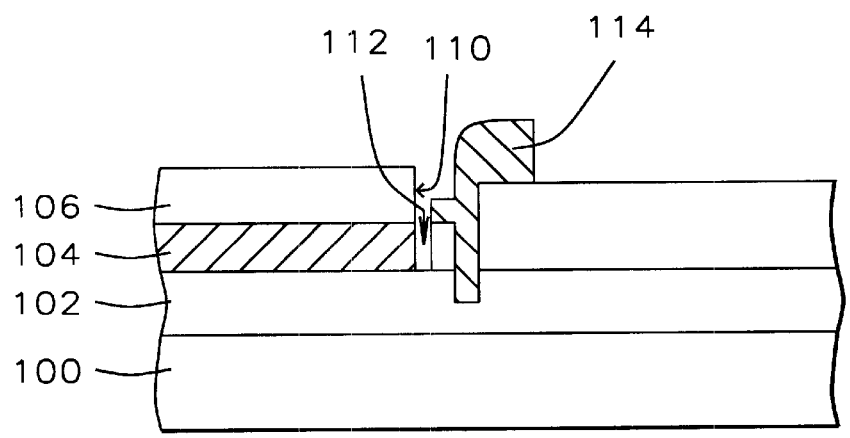
FIG. 1B – Prior Art

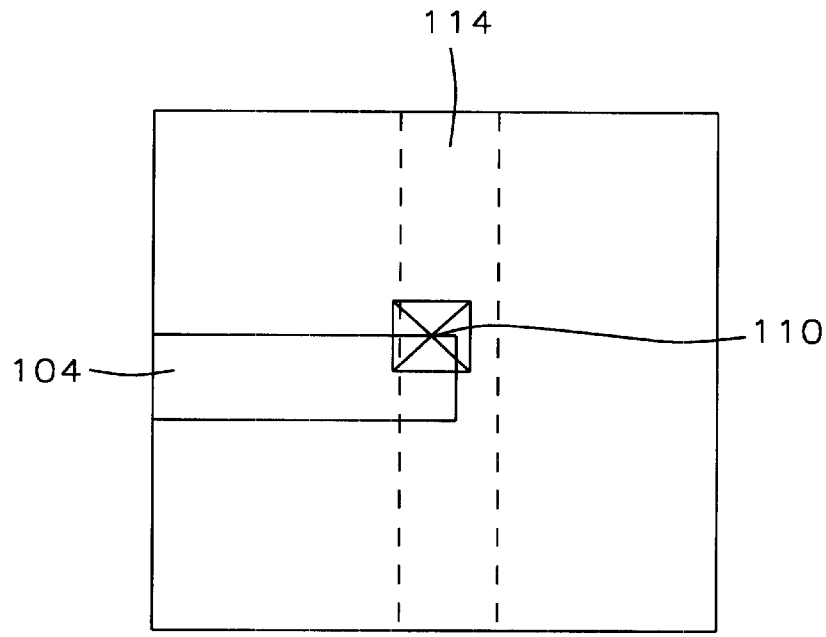
*FIG. 1C - Prior Art*
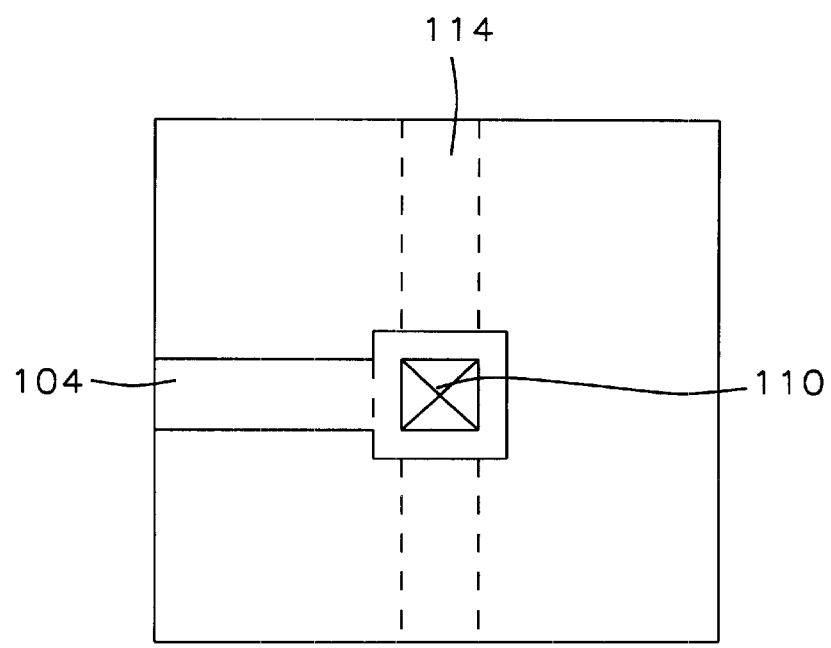
*FIG. 1D - Prior Art*

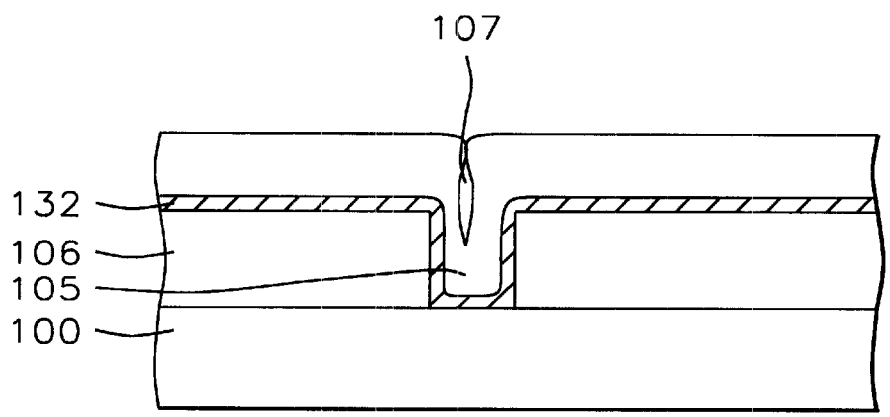
*FIG. 1E – Prior Art*
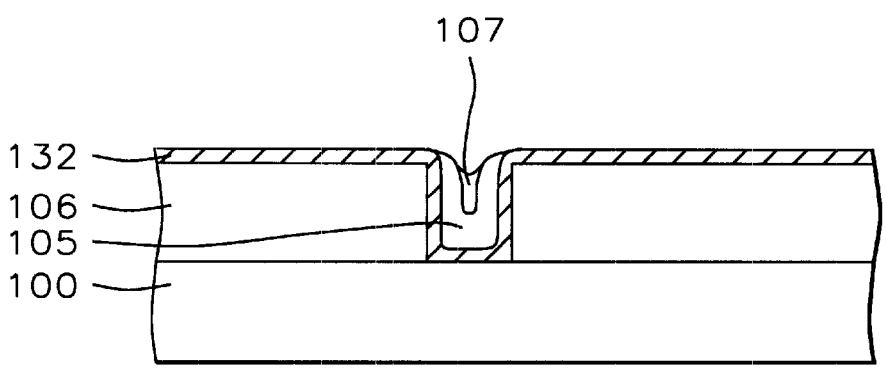
*FIG. 1F – Prior Art*

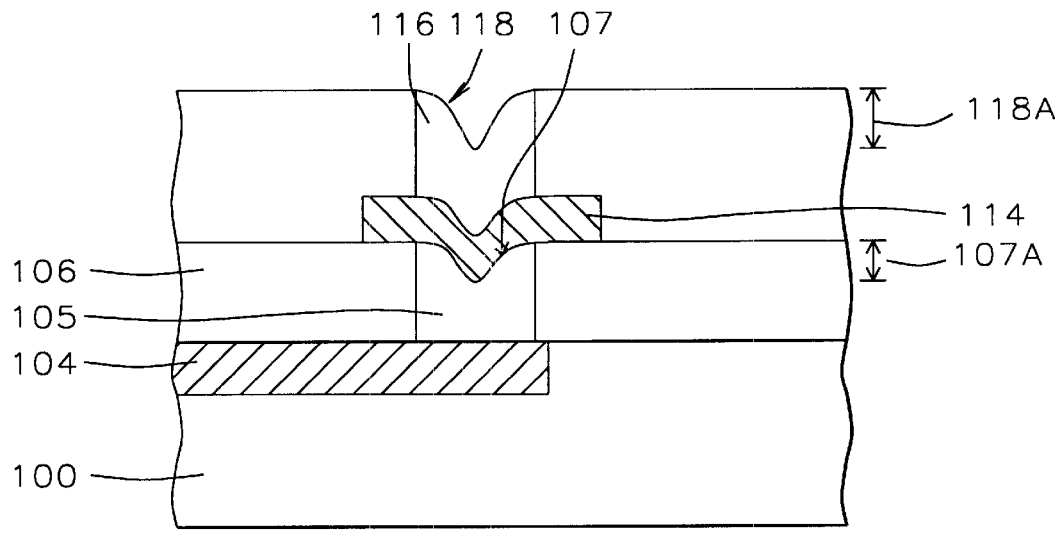
FIG. 1G – Prior Art
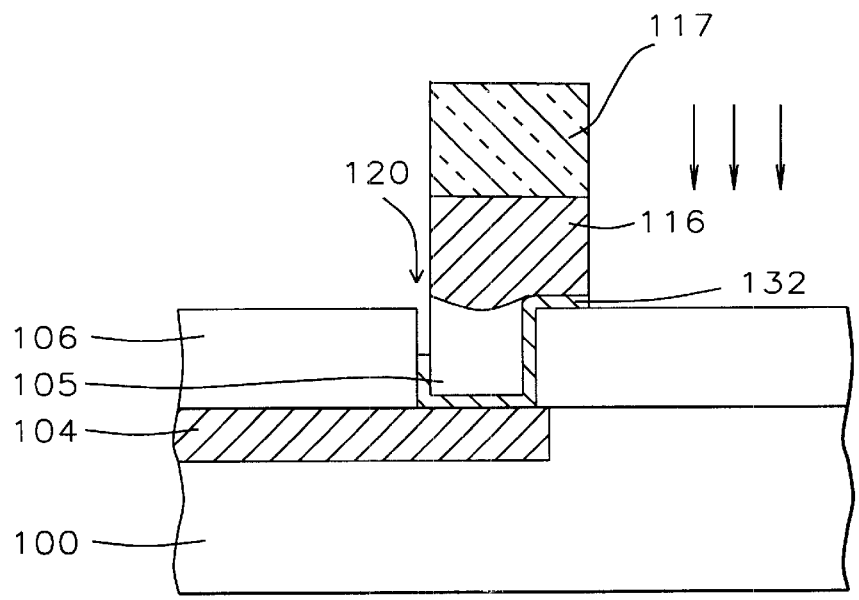
FIG. 1H – Prior Art

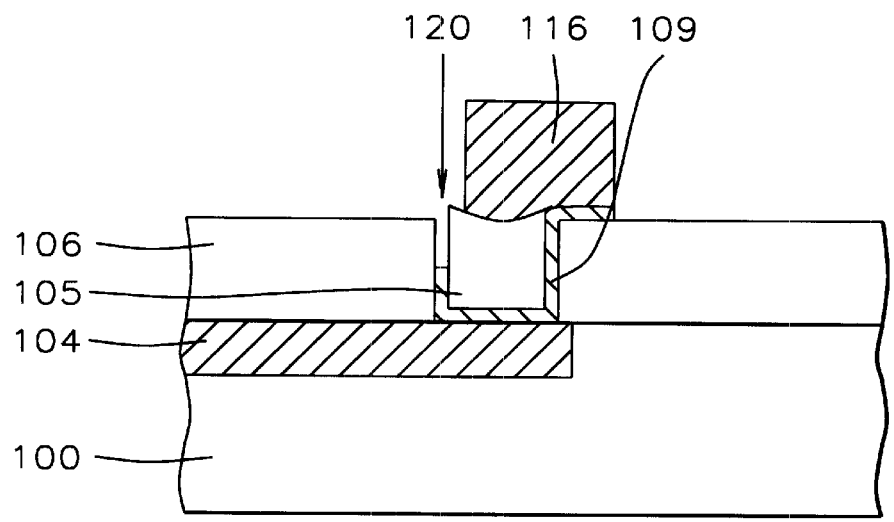
FIG. 1I – Prior Art
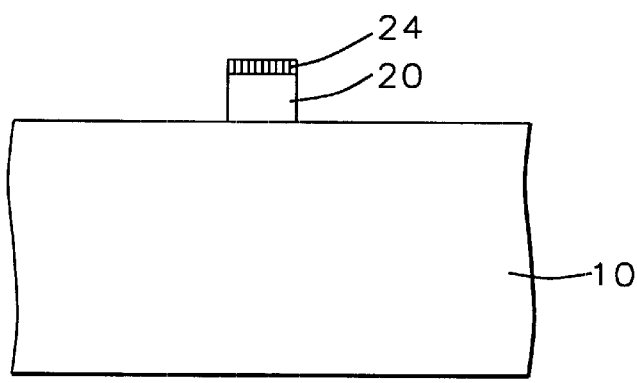
FIG. 2A
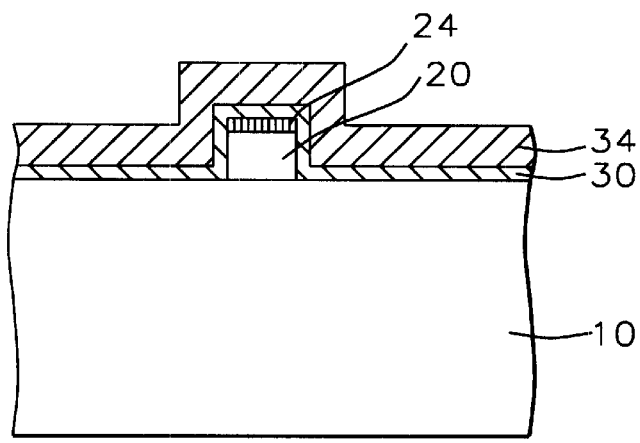
FIG. 2B

MULTI-LAYER WIRING STRUCTURE HAVING CONDUCTIVE SIDEWALL ETCH STOPPERS AND A STACKED PLUG INTERCONNECT

This is a division of patent application Ser. No. 08/643,716, filing date May 6, 1996 now U.S. Pat. No. 5,756,396, A Multi-Layer Wiring Structure Having Conductive Sidewall Etch Stoppers And A Stacked Plug Interconnect, assigned to the same assignee as the present invention.

BACKGROUND OF INVENTION

1) Field of the Invention

This invention relates generally to a semiconductor device having a multi-layered wiring structure and a method of manufacturing the same and more particularly, to a semiconductor device in which different wiring layers are connected to each other by a metal plug in a via and a method of manufacturing the same.

2) Description of the Prior Art

Multi-layer interconnects are important technology in semiconductor manufacturing. Interconnects electrically, connect together different conductive wiring layers in a semiconductor chip. The conductive layers can be layers formed on a substrate surface, such as source/drain contacts or gate structures, or overlying metal wiring layers. It is important that these interconnects, vias, and conductive wiring layers be reliable, be as small as possible to miniaturize the circuit and have wide process windows for high yields.

Conventional processes have at least the following three major problems: (1) via/wiring etch misalignment, (2) voids (dimples) in the tops of the tungsten plugs, and (3) recesses in the barrier layers surrounding tungsten plugs. These problems are explained below.

1) Via Misalignment/Metal Patterning Misalignment Problem

The conventional processes have via misalignment/metal patterning misalignment which leads to shorting and defects. A conventional method of manufacturing a semiconductor device having a multi-layered wiring structure in which respective wiring layers are connected to each other by a via will be described with reference to FIGS. 1A to 1D. As shown in FIG. 1A, a silicon oxide layer 102 is formed on a silicon substrate 100 by a chemical vapor deposition method. A first aluminum layer is deposited on the entire surface of the silicon oxide layer and is patterned to form a first wiring layer 104. Then a thick silicon oxide film 106 is formed over the entire surface of the resultant structure. Subsequently, the silicon oxide film formed over the first wiring layer 104 is removed by an reactive ion etch (RIE) method using a predetermined mask, thereby forming a through-hole (via) 110.

However, as shown in FIG. 1A and in top plan view FIG. 1C, the via 110 may not be formed in the correct position over the metal line 104 due to mask misalignment or process variation. If the via hole 110 deviates from the correct position in this manner, a portion of the silicon oxide film 102 near the wiring layer 104 is etched. In this case a leakage current is produced between the second wiring layer 114 and an underlying polycrystalline silicon wiring layer (not shown) or the silicon substrate 100, or defects such as short circuits occur in the worst case.

As shown in FIGS. 1B and 1C, when the second metal 114 mask/etch is misaligned with respect to the via hole 110, the first wiring layer 104 is mis-etched thus causing a reliability or disconnection defect.

Referring to FIG. 1D, to remedy these two misalignment and etch problems, manufacturers have increased the area of the wiring layers 104 114 under the vias 110, but this has increased the size of the chips.

Workers in the art are aware of this first problem of over etching around first level metal contacts (wire layer). For example U.S. Pat. No. 5,286,674 (Roth) shows a method of forming sidewall spacers formed of a dielectric material on the adjacent sides of metal lines so that during formation of a via in the overlying dielectric layer, the sidewall spacers prevent trenching of underlying dielectric layer. The sidewall spacers are formed of an overlying dielectric material. However, this invention could be improved by providing a larger metal plug/wire layer contact area that lowers the contact resistance.

U.S. Pat. No. 5,462,893 (Matsulka) shows a method of improving metal interconnections. Matsulka uses amorphous polysilicon layer 14 as an etch stop on the sidewalls of a first wiring layer. However, this invention could also be improved by providing a larger metal plug/wire layer contact area that lowers the contact resistance.

U.S. Pat. No. 5,451,543 (Woo et al.) shows a method for making a vertical profile contact opening using an etch stop layer, interposed between a conductive layer and a dielectric layer.

These patents help prevent some of the over etch problems, but further improvement can be made by improving the sidewall spacer, allowing further reduction in the metal line width (e.g., metal contact), and allowing more alignment tolerance for the via etch.

2) W-plug Dimple Recess Problem

A second problem with current processes is the depression (void, or dimple) 107 118 formation in the conductive plug as shown in FIGS. 1E and 1G. A contact hole is formed in an insulating layer 106. Next, a barrier metal 132 is formed over the contact hole. The barrier layer is thicker at the top of the contact hole than at the bottom due to the deposition dynamics. A tungsten layer 105 is formed filling the hole and a void (or buried seam) 107 forms because of the barrier layer overhang and the tungsten deposition dynamics. As shown in FIG. 1F, when the tungsten layer is etched back the buried seam is exposed forming a dimple 107. The depth of the dimple 107 can be in the range of between about 500 and 4000 Å and the overall tungsten plug 105 depth (i.e., the thickness of layer 106) is in the range of between about 8000 and 10,000 Å.

As shown in FIG. 1G, a metal layer 114 and a second tungsten plug 116 are formed over the dimple 107. The dimple 107 is replicated and made deeper in the second tungsten layer forming a second dimple 118. The second dimple 118 has a depth 118A as shown in FIG. 1G. This dimple causes reliability problems.

3) TiN Barrier Recess Problem

A third problem with conventional processes is the barrier layer recess 120 as shown in FIGS. 1H and 1I. As shown in FIG. 1H, a first metal layer 104, a barrier layer 132, and a tungsten plug 105 are formed. Next a second metal layer 116 and a second metal photo resist pattern 117 is formed over the surface. Normal photo process variations can cause the photo resist pattern 117 to be misaligned. During the subsequent etch, the exposed barrier layer 132 will be etched away. As shown in FIG. 1I, a recess 120 is formed. This recess will cause reliability and yield losses.

Therefore, there is a need for an improved interconnect structure and process that can overcome the above three problems. The method/structure is needed that prevents the via misalignment and second metal misalignment etch problems (FIG. 1B), allows further reduction in the metal line (104) width (FIG. 1D), reduces metal contact resistance, and allows more alignment tolerance for the via etch (FIG. 1C). Moreover, the method/structure should alleviate the conductive plug depression (dimple) problem (FIG. 1G) and the barrier layer recess problem (FIG. 1I).

SUMMARY OF THE INVENTION

It is an object of the present invention to provide a method and a structure for forming an interconnect structure that electrically connects wiring layers and that reduces wiring width.

It is an object of the present invention to provide a structure and a method for connecting different metal layers without increasing wiring pitch or reducing via tolerances, and for alleviating the conductive plug dimple problem and the barrier layer recess problem.

It is another object of the present invention to provide a structure and a method for a wiring layer that has conductive sidewall spacers and a stacked plug interconnect that fills up depressions (e.g., dimples) in the underlying plug and recesses in the plug barrier layer.

In brief, to accomplish the above objectives, the present invention provides a structure and a method of electrically connecting two wiring layers. The first wire layer is formed over a dielectric layer and a TiN layer is formed over the top of the first wire layer, Next, sidewall spacers composed of titanium nitride and tungsten are formed on the first wire layer sidewalls. An inter metal dielectric (IMM) layer is formed over the surface and a via is etched exposing the first wire layer. A tungsten plug with an outer TiN barrier layer is formed filling the via. On top of the tungsten plug, a second wire layer is formed also having titanium nitride and tungsten sidewall spacers. The titanium nitride/tungsten spacers act as an etch stop for the via etch and also increase the contact area of the first and second wiring layers. The spacers also fill in TiN barrier layer recesses in the tungsten plug and fill in (voids) dimples in the top of the tungsten plug.

In slightly more detail, the method of making a multi-layered semiconductor interconnect device with conductive sidewall etch stoppers and a stacked plug interconnect begins by providing a semiconductor substrate having an overlying insulating layer. Next, a first wiring layer is formed over said substrate insulating layer. First conductive sidewall spacers are formed on the sidewalls of the first wiring layer. An inter metal dielectric layer is formed over the first wiring layer, the first conductive sidewall spacers, and the substrate. A via is etched through the inter metal dielectric layer exposing portions the first wiring layer and portions of the first conductive spacers. The via opening is defined by sidewalls of the inter metal dielectric layer. A plug barrier layer is formed over the inter metal dielectric layer and over the sidewalls of the inter metal dielectric layer. A tungsten plug is formed filling the via opening thereby forming an interconnect.

The invention provides an interconnect structure comprising: a first wiring layer having a predetermined wiring width and a predetermined shape on a semiconductor substrate the first wiring layer having sidewalls; first conductive sidewall spacers formed on the sidewalls of the first wiring layer; an inter metal dielectric layer covering the first wiring layer and the first conductive sidewall spacers; a via in the inter metal dielectric layer over at least a portion of the first conductive sidewall spacers, the via having a width smaller than the total width of the first conductive sidewall spacers and the first wiring layer; a first tungsten plug in the via electrically connected to at least the first conductive spacer; the first tungsten plug having a top, bottom and sides; the first tungsten plug having an outer coating of titanium nitride covering the bottom and sides; a second wiring layer having a predetermined wiring width and a predetermined shape; the second wiring layer over and contacting a portion of the first tungsten plug; the second wiring layer having sidewalls; and second conductive sidewall spacers on the sidewalls of the second wiring layer.

The method of the instant invention reduces the size of the chip by about 30 to 60% over conventional processes by reducing the size of the metal lands and via extensions. The conductive spacers on the first and second wiring layers increase the metal layer contact area providing more via hole tolerance and lowers contact resistance. Second, the invention fills up TiN recesses in the TiN plug barrier layer that surrounds the tungsten plug, thereby forming a more reliable and stable connection between the first and second metal layers. Third, the invention improves connection between the first and second metal layer where the W-plug dimple is filled in with the tungsten with the tungsten spacers is formed. This improves the conductivity and reliability of the interconnection.

BRIEF DESCRIPTION OF THE DRAWINGS

The features and advantages of the method for providing an interconnect structure according to the present invention and further details such method in accordance with the present invention will be more clearly understood from the following description taken in conjunction with the accompanying drawings in which like reference numerals designate similar or corresponding elements, regions and portions and in which:

FIGS. 1A and 1B are cross sectional views for illustrating of a method of forming a metal layer contact according to the prior art.

FIGS. 1C and 1D are top plan views showing the via and metal contact locations for the prior art processes.

FIGS. 1E, 1F and 1G show the conductive plug depression (dimple) problem of the prior art.

FIGS. 1H and 1I show the plug (TiN) barrier layer recess problem of the prior art.

FIGS. 2A, 2B, 3, 4, 5, 6, 7A, 7B, and 8 are cross sectional views that illustrate an embodiment of the structure and method of forming the interconnect structure according to the present invention.

DETAILED DESCRIPTION OF THE PREFERRED EMBODIMENTS

Figure 3:
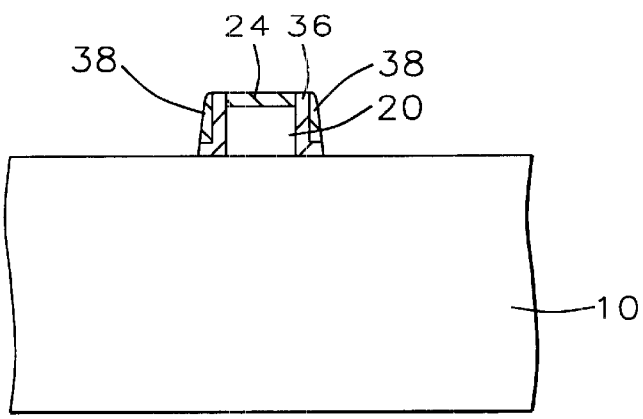

The present invention will be described in detail with reference to the accompanying drawings. As shown in FIG. 2A, the method begins by providing a substrate 10. The preferred substrate is composed of a P-type single crystal silicon having a (100) crystallographic orientation. The term "substrate" is meant to include devices formed within a semiconductor wafer, such as source and drains, and the layers overlying the wafer, such as contacts, conductive and insulating layers. The term "substrate surface" is meant to include the upper most exposed layers on a semiconductor wafer, such as a silicon surface, an insulating layer and metallurgy lines. The substrate preferably further includes a top dielectric layer (not shown, but underlies the first metal line 20) composed of a material selected from the group consisting of: silicon oxide, silicon nitride, spin-on-glass, plasma oxide or LPCVD oxide.

Still referring to FIG. 2A, a first wiring layer 20 and a top coating 24 are formed over the substrate. The layers 20 24 are then patterned using conventional photo processes. The first wiring layer 20 preferably has vertical sidewalls. The first wiring layer 20 is preferably composed of aluminum, tungsten, titanium, copper, polysilicon, polycide, or alloys of these metals. The first metal layer 20 preferably has a thickness in the range of between about 3000 and 10,000 Å and more preferably about 4000 Å. The first metal layer 20 preferably has a width in the range of between about 4000 and 8000 Å and more preferably about 5000 Å. A preferred process to form the metal layer is a Ti/TiN/AlCu/TiN process. Also, the first metal layer of the present invention can be formed over sources and drain to form a contact.

The first wiring layer 20 preferably includes a top Anti-Reflection—Coating (ARC) barrier layer 24 of titanium nitride (TiN) material or other metals with reflectivity less than the reflectivity of AlCu and is more preferably formed of TiN. The top barrier layer of ARC titanium nitride preferably has a thickness in the range of between about 300 and 1500 Å and more preferably about 1400 Å. The top layer 24 is optional. The top ARC layer 24 improves the performance of the photo processes and allows smaller lines to be formed.

As shown in FIG. 2B, a barrier layer 30 is then formed over the first wiring layer 20. The barrier layer 30 is preferably formed of titanium nitride, Ti/TiN, or Ti/W, and is more preferably formed of titanium nitride (TiN). The barrier layer 30 improves the adhesion of the subsequent overlying tungsten layer. The barrier layer 30 preferably has a thickness in the range of between about 100 and 500 Å and more preferably about 300 Å.

Still referring to FIG. 2B, a metal layer 34, preferably composed of tungsten, is deposited over the barrier layer 30. The metal layer 34 preferably has a thickness in the range of between about 1000 and 4000 Å and more preferably about 1500 Å. Metal layer 34 can be formed of any other metals, such as Al, and Cu.

As shown in FIG. 3, the metal (e.g., tungsten) layer 34 and the barrier layer 30 are anisotropically etched forming first conductive (e.g., tungsten/titanium nitride) sidewall spacers (i.e., conductive etch stop) 36 38 on the sidewalls of the first wiring layer 20. The first tungsten/titanium nitride sidewall spacers 36 38 have an overall width in the range of between about 500 and 1500 Å. The preferred materials (e.g., W/TiN) of the spacers have the important characteristics of high conductivity, and high resistance to oxide etches significantly improve the process of the present invention. First conductive double sidewall spacers are comprised of a first inner film 36 and a first outer film 38 formed only on the sidewalls of the first wiring layer. See FIG. 3. The first conductive double sidewall spacers are not under the first wiring layer. The top surface of the first wiring layer covered by an anti-reflecting titanium nitride coating.

Figure 4:
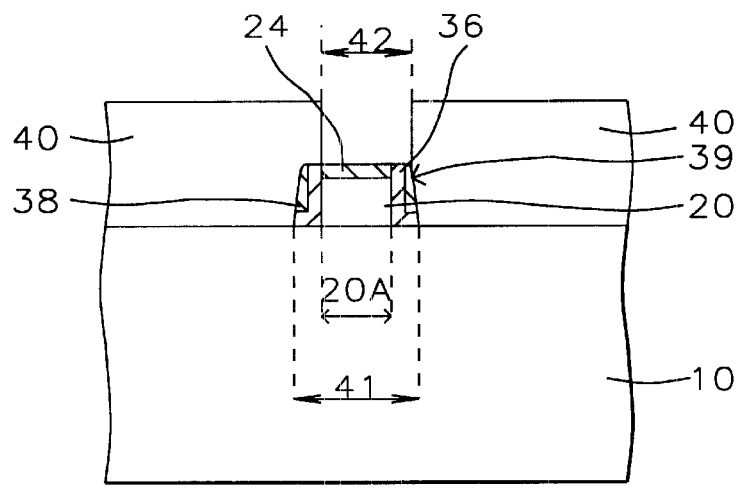

As shown in FIG. 4, an inter metal dielectric (IMM) layer 40 is formed over the first wiring layer 20, sidewall spacer, and the substrate 10. The inter metal dielectric layer 40 is preferably formed of plasma oxide, spin-on-glass, or LPCVD oxide material and more preferably of plasma oxide material and preferably has a thickness in the range of between about 5000 and 15,000 Å and more preferably a thickness of about 10,000 Å.

As shown in FIG. 4, a via opening 42 is etched through the inter metal dielectric layer 40 and exposes portions the first wiring layer 20 and portions of the first tungsten/titanium nitride spacers 36 38. The via opening 42 is defined by sidewalls of the inter metal dielectric layer 40. The via etch is preferably performed with an anisotropic etch using a fluorine containing gas, such as $CHF_3$ or $CF_4$.

As shown in FIG. 4, the top Anti-Reflection—Coating (ARC) layer 24, the sidewall barrier layer 36 and the tungsten sidewall spacers 38 act as an etch stop for the etch. FIG. 4 shows an example of a via misalignment 39 where the via etch was stopped by the TiN/W etch stop 36 38. The sidewall spacers (etch stops) 36 38 of the present invention prevented the via etch from reaching and etching the underlying layers 10.

Note that, in FIG. 4, the acceptable range where the via can be formed is the combined width 41 of the metal line 20 and the spacers 36 38. The wire line and spacers 36 38 will prevent the via from etching the underlying layers. In addition, the conductive spacers 36 38 increase the area of the electrical connection (between line 20 and plug 50) thus increasing the conductivity and speed. This allows smaller line pitches to be used to achieve the same via tolerances and conductivity thus allowing the chip size to be reduced.

Figure 5:
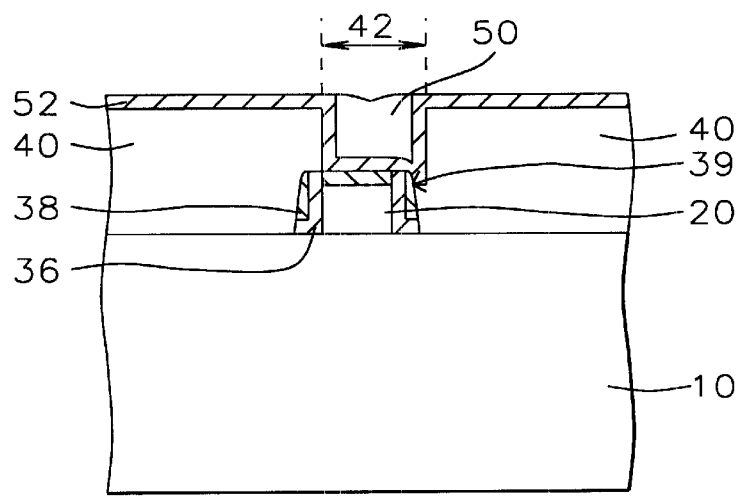

As shown in FIG. 5, a plug barrier layer 52 is deposited over the inter metal dielectric (IMD) layer 40 and over the sidewalls of via hole 42 (i.e., sidewall of the inter metal dielectric layer 40).

The plug barrier layer 52 preferably has a thickness in the range of between about 300 and 1500 Å and more preferably about 1000 Å. The plug barrier layer 52 preferably is formed of titanium nitride TiN, TiW, or Ti/TiN and more preferably formed of titanium nitride Still referring to FIG. 5, a tungsten plug 50 is deposited thus filling the via opening 42. Preferably a tungsten layer blanket deposited and etched back to form the tungsten plug. The tungsten plug 50 preferably has a thickness in the range of between about 3000 and 8000 Å and more preferably about 4000 Å. The plug barrier layer 52 is preferably removed.

Figure 6:
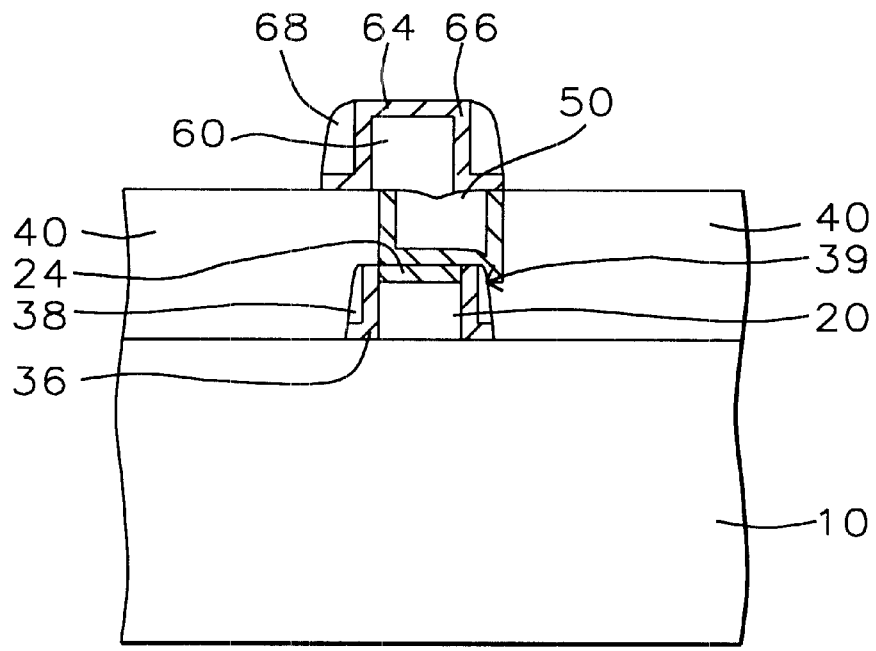

Subsequently, a second wiring layer 60, second top Anti-Reflection—Coating (ARC) barrier coating 64, and a second conductive (e.g., tungsten/titanium nitride) spacers 66 68 are formed over the tungsten plug 50 as shown in FIG. 6. The second metal layer 60, second top coating 64, and the second spacers 66 68 are preferably formed using the same processes described above for the first wiring layer 20, first top ARC barrier layer 24, and first spacers 36 38.

The second wiring layer 60 preferably is formed of the same materials as first wiring layer 20 as discussed above. The second wiring layer 60 preferably has a thickness in the range of between about 3000 and 8000 Å and a width in the range of between about 0.4 and 1.0 $\mu$m. The second wiring layer can be formed of a metal alloy layer consisting of aluminum and silicon or an alloy layer consisting of aluminum (al), silicon, and cooper on the entire surface by a sputtering method, and then the formed alloy layer (and second top barrier coating 64) is patterned by a photoengraving process (PEP) and reactive ion etch, forming a second wiring layer. The second top ARC barrier coating 64 is preferably formed similarly to the first top ARC barrier layer 24 as explained above.

The second tungsten/titanium nitride spacers (i.e., etch stop) 66 68 are formed in a similar process as used to form the first tungsten/titanium nitride spacers (i.e., etch stop) 36 38. The second tungsten/titanium nitride spacers 66 68 preferably have a width in the range of between about 500 and 1500 Å. Second conductive double sidewall spacers are made of two spacers of a second inner film and an second outer film on the sidewalls of the second wiring layer. The second conductive double sidewall spacer are not under the second wiring layer.

Figure 7A:
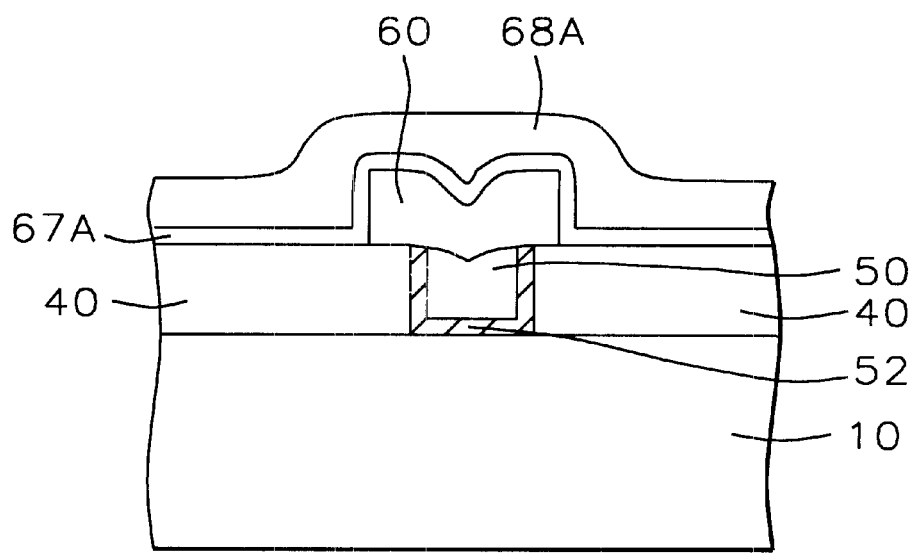
Figure 7B:
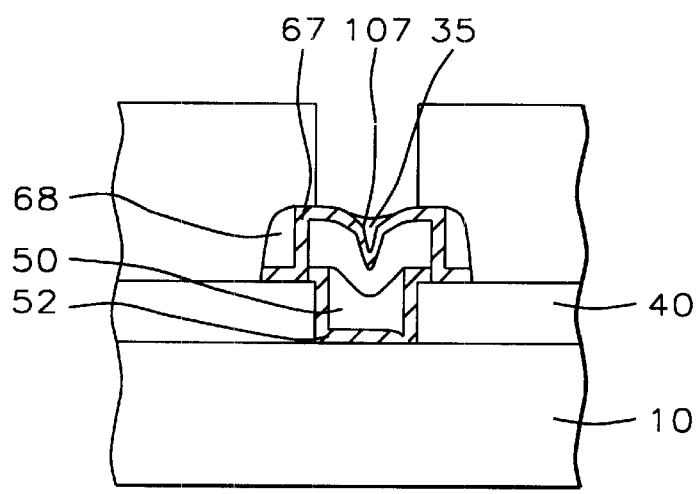

As discussed in the prior art section (FIG. 1E), dimple (voids) 107 118 in the conductive plug 50 105 116 are caused by inherent process characteristic in plug formation and are a major problem. However, as shown in FIGS. 7A and 7B the conductive layers (e.g., TiN and tungsten) 67A 68A (of the present invention), which is used to form the sidewall spacers 67 68, and also evenly fills 35 in the dimple 107 in the tungsten plug. As shown in FIG. 7A, blanket barrier layer 67a (e.g., TiN) and a tungsten layer 68A are formed over the substrate surface. The barrier layer 67A and the tungsten layer are etched back to form the sidewall spacers 67 68 and fill up 35 the dimple 107 to create a smooth conductive surface. This reduces the contact resistance of the plugs. Another benefit of the invention is that overlying metal plugs will not have an increase dimple problem due to an underlying dimple. See FIG. 1E, dimple 118.

Figure 8:
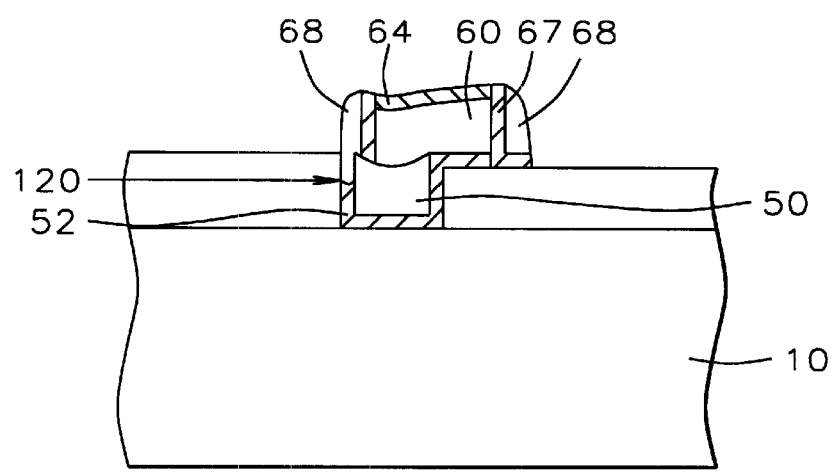

As discussed in the prior art (FIGS. 1H and 1I), recesses 120 forming in the plug barrier layer 52 are caused by a misalignment in the overlying metal layer etch. However, as shown in FIG. 8, the sidewall spacers 68 of the present invention fill in the recesses 120 in the titanium nitride plug barrier layer 52 and thus alleviate the problem. By filling the recesses 120 with conductive spacer material (e.g., TiN and W) 67 68, the reliability problems associated with the recess are eliminated.

The conductive spacers (e.g., TiN and W) 67 68 of the invention are better than the dielectric spacers or polysilicon spacers because the conductive spacers will lower the contact resistance of the interconnection and provide a better etch stop material (higher selectivity).

The structure and method of the instant invention reduce the size of the chip by allowing the sized of the bottom metal contact pad to be reduced. First, the conductive spacers 36 38 66 68 on the first and second wiring layers increase the metal layer via contact area 41 (FIG. 4) allowing more via hole tolerances. The conductive spacers increase the interconnection conductivity which allows smaller vias to be formed and smaller wiring pitches which reduce chip size. The invention fills up TiN recesses in the TiN layer that surrounds the W plug, thereby forming a more reliable and stable connection between the first and second metal layers.

Chip size is reduced by allowing the use of vertically stacked plugs. The plugs can be vertically stacked without reliability problems because the dimple is filled. Also, the invention improves connection between the first and second metal layer where the W-plug dimple is filled in with tungsten when the tungsten spacers are formed. This improves the conductivity and reliability of the interconnection.

While the invention has been particularly shown and described with reference to the preferred embodiments thereof, it will be understood by those skilled in the art that various changes in form and details may be made without departing from the spirit and scope of the invention.

What is claimed is:

1. A semiconductor device having a multi-layered wiring structure on a semiconductor substrate, comprising:
    a) a first wiring layer having a predetermined wiring width and a predetermined shape on a semiconductor substrate, said first wiring layer having sidewalls;
    b) first conductive sidewall spacers composed of a first inner titanium nitride film and a first outer tungsten film formed on said sidewalls of said first wiring layer; said first conductive sidewall spacers not under said first wiring layer;
    c) an inter metal dielectric layer covering said first wiring layer and said first conductive sidewall spacers;
    a d) a via in said inter metal dielectric layer over at least a portion of said first conductive sidewall spacers, said via having a width smaller than the total width of said first conductive sidewall spacers and said first wiring layer;
    e) a first plug in said via electrically connected to at least said first conductive spacer; said first plug having a top, bottom and sides; said first plug has a dimple;
    f) a second wiring layer having a predetermined wiring width and a predetermined shape; said second wiring layer over and contacting a portion of said first plug; said second wiring layer having sidewalls; and
    g) second conductive sidewall spacers composed of a second inner titanium nitride film and a second outer tungsten film on said sidewalls of said second wiring layer; said second conductive sidewall spacers not under said second wiring layer; said second inner titanium nitride film is at least partially located within said dimple.

2. The semiconductor device of claim 1 wherein said first and second conductive sidewall spacers have a width in the range of between about 500 and 1500 Å.

3. The semiconductor device of claim 1 wherein said first and second wiring layers are composed of a material selected from the group consisting of: aluminum, copper, and compounds of aluminum.

4. The semiconductor device of claim 1 wherein said first and second wiring layers have a width and a thickness in the range of between about 4000 and 8000 Å.

5. The semiconductor device of claim 1 wherein said first wiring layer further includes a top surface covered by an anti-reflecting titanium nitride coating; said anti-reflecting titanium nitride coating not on the sidewalls of said first plug.

6. A semiconductor device having a multi-layered wiring structure on a semiconductor substrate, comprising:
    a) a first wiring layer having a predetermined wiring width and a predetermined shape on a semiconductor substrate; said first wiring layer having sidewalls and a top surface;
    b) first conductive double sidewall spacers composed of a first inner film and a first outer film; said first inner film formed on said sidewalls of said first wiring layer and on said semiconductor substrate; said first conductive double sidewall spacers are not under said first wiring layer; said top surface of said first wiring layer covered by an anti-reflecting titanium nitride coating;
    c) an inter metal dielectric layer covering said first wiring layer and said first conductive double sidewall spacers;
    d) a via in said inter metal dielectric layer over at least a portion of said first conductive double sidewall spacers, said via having a width smaller than the total width of said first conductive double sidewall spacers and said first wiring layer;
    e) a first tungsten plug in said via electrically connected to at least said first conductive double sidewall spacer; said first tungsten plug having a top, bottom and sides; said first tungsten plug having a dimple;
    f) a second wiring layer having a predetermined wiring width and a predetermined shape; said second wiring layer over and contacting a portion of said first tungsten plug; said second wiring layer having sidewalls; and
    g) second conductive double sidewall spacers composed of an inner film and an outer tungsten film on said sidewalls of said second wiring layer; said inner film at least partially located within said dimple.

7. The semiconductor device of claim 6 wherein said first conductive double sidewall spacers have a width in the range of between about 500 and 1500 Å.

8. The semiconductor device of claim 6 wherein said first inner film of said conductive double sidewall spacers is composed of a material selected from the group consisting of TiN, TiW, and Ti/TiN and said first outer film is comprised of tungsten (W).

9. The semiconductor device of claim 6 wherein said first wiring layer is composed of a material selected from the group consisting of: aluminum, copper, and compounds of aluminum.

10. A semiconductor device having a multi-layered wiring structure on a semiconductor substrate, comprising:

a) an inter metal dielectric layer over a semiconductor substrate;

b) a via in said inter metal dielectric layer;

c) a first tungsten plug in said via; said first tungsten plug having a top, bottom and sides; said first tungsten plug has a dimple;

d) a second wiring layer having a predetermined wiring width and a predetermined shape; said second wiring layer over and contacting a portion of said first tungsten plug; said second wiring layer having sidewalls; and e) second conductive double sidewall spacers made of two spacers of a second inner film and a second outer film on said sidewalls of said second wiring layer; said second conductive double sidewall spacers are not under said second wiring layer; and said second inner film is at least partially located within said dimple.

11. The semiconductor device of claim 10 wherein said first tungsten plug has an outer coating of titanium nitride covering said bottom and sides.

12. The semiconductor device of claim 10 wherein said second inner film is composed of titanium nitride and said second outer film is composed of W.

* * * * *